United States Patent
Van Heck et al.

(10) Patent No.: US 9,078,361 B2
(45) Date of Patent: Jul. 7, 2015

(54) ASSEMBLY, COMPONENT FOR AN ASSEMBLY AND METHOD OF MANUFACTURING AN ASSEMBLY

(75) Inventors: Gerardus Titus Van Heck, Eindhoven (NL); Margaretha Maria De Kok, Eindhoven (NL); Jeroen Van Den Brand, Goirle (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 199 days.

(21) Appl. No.: 13/575,036

(22) PCT Filed: Jan. 31, 2011

(86) PCT No.: PCT/NL2011/050064
§ 371 (c)(1),
(2), (4) Date: Sep. 6, 2012

(87) PCT Pub. No.: WO2011/093713
PCT Pub. Date: Aug. 4, 2011

(65) Prior Publication Data
US 2013/0200783 A1    Aug. 8, 2013

(30) Foreign Application Priority Data
Jan. 29, 2010 (EP) .................................. 10152129

(51) Int. Cl.
*H05K 1/02* (2006.01)
*H01L 27/32* (2006.01)
(Continued)

(52) U.S. Cl.
CPC ........... *H05K 1/0277* (2013.01); *Y10T 29/4913* (2015.01); *G09F 9/00* (2013.01);
(Continued)

(58) Field of Classification Search
CPC ................. H01L 2224/73265; H01L 2224/74; H01L 51/0097; H05K 1/0277

USPC .................................................. 313/498–512
See application file for complete search history.

(56) References Cited

U.S. PATENT DOCUMENTS 3,255,047 A  6/1966  Escoffery
5,212,916 A  5/1993  Dippel et al.
(Continued)

FOREIGN PATENT DOCUMENTS

DE  102004021570  1/2005
DE  102005041333  1/2007
(Continued)

OTHER PUBLICATIONS

International Search Report, PCT/NL2011/050063, mailing date: Jul. 1, 2011.
(Continued)

*Primary Examiner* — Anne Hines
(74) *Attorney, Agent, or Firm* — Banner & Witcoff, Ltd.

(57) ABSTRACT

An assembly is provided of an electro-physical transducer (10) on a flexible foil (20) with a carrier (40). The flexible foil (20) has a first main surface (22) provided with at least a first electrically conductive track (24) connected to the electro-physical transducer and opposite said first main surface a second main surface (23) facing towards the carrier. At least a first incision (25a) extends through the flexible foil alongside said at least a first electrically conductive track, therewith defining a strip shaped portion (27) of the flexible foil that carries a portion of the at least a first electrically conductive track. The at least a first electrically conductive track is electrically connected to an electrical conductor (421) of the carrier, and the flexible foil is attached to the carrier with its strip shaped portion.

23 Claims, 9 Drawing Sheets

(51) Int. Cl.
*H01L 51/52* (2006.01)
*H01R 4/70* (2006.01)
*H05K 3/36* (2006.01)
*H05B 33/08* (2006.01)
*H05B 33/10* (2006.01)
*H05K 13/04* (2006.01)
*H01L 31/0392* (2006.01)
*H01L 31/042* (2014.01)
*G09F 9/00* (2006.01)
*G09F 19/22* (2006.01)
*H01R 4/04* (2006.01)
*H01R 12/70* (2011.01)
*H05K 1/03* (2006.01)
*H05K 1/14* (2006.01)
*H05K 1/18* (2006.01)
*H05K 3/32* (2006.01)

(52) U.S. Cl.
CPC ........... *G09F 19/22* (2013.01); *H01L 27/3293* (2013.01); *H01L 51/5203* (2013.01); *H01L 2251/5338* (2013.01); *H01L 2251/5361* (2013.01); *H01R 4/04* (2013.01); *H01R 4/70* (2013.01); *H01R 12/7076* (2013.01); *H05K 1/0283* (2013.01); *H05K 1/038* (2013.01); *H05K 1/147* (2013.01); *H05K 1/189* (2013.01); *H05K 3/321* (2013.01); *H05K 3/325* (2013.01); *H05K 3/365* (2013.01); *H05K 2201/029* (2013.01); *H05K 2201/0311* (2013.01); *H05K 2201/046* (2013.01); *H05K 2201/083* (2013.01); *H05K 2201/09081* (2013.01); *H05K 2201/09281* (2013.01); *H05K 2201/10106* (2013.01); *H05K 2201/10287* (2013.01); *H05K 2201/10484* (2013.01); *H05B 33/0896* (2013.01); *H05B 33/10* (2013.01); *H05K 13/04* (2013.01); *H01L 31/0392* (2013.01); *H01L 31/042* (2013.01); *Y02E 10/50* (2013.01)

(56) References Cited

U.S. PATENT DOCUMENTS

| | | | |
|---|---|---|---|
| 2004/0069341 | A1 | 4/2004 | Heidrich |
| 2004/0192082 | A1 | 9/2004 | Wagner et al. |
| 2004/0224138 | A1 | 11/2004 | Farrell et al. |
| 2006/0005876 | A1 | 1/2006 | Gaudiana |
| 2007/0115572 | A1 | 5/2007 | Van Dam et al. |
| 2008/0178453 | A1* | 7/2008 | Gnade ............................. 29/428 |
| 2009/0109368 | A1 | 4/2009 | Watanabe et al. |
| 2010/0149767 | A1* | 6/2010 | Biesheuvel et al. ........... 361/760 |

FOREIGN PATENT DOCUMENTS

| | | |
|---|---|---|
| EP | 1369923 | 12/2003 |
| EP | 2107642 | 10/2009 |
| JP | S61133978 A | 6/1986 |
| JP | H09-205257 A | 8/1997 |
| JP | 2009-139463 A | 6/2009 |
| WO | 96/39707 A1 | 12/1996 |
| WO | 2008/007237 | 1/2008 |
| WO | 2008/099306 | 8/2008 |
| WO | 2008/120138 | 10/2008 |
| WO | 2009/133497 A1 | 11/2009 |
| WO | 2009/134127 A1 | 11/2009 |
| WO | 2010/067283 A1 | 6/2010 |

OTHER PUBLICATIONS

International Search Report, PCT/NL2011/050062, mailing date: Jun. 16, 2011.
International Search Report, PCT/NL2011/050064, mailing date: Aug. 9, 2011.
Linz T et al: "Embroidering Electrical Interconnects with Conductive Yarn for The Integration of Flexible Electronic Modules into Fabric". Wearable Computers. 2005. Proceedings. Ninth IEEE International Sympos Ium on Osaka. Japan Oct. 18-21, 2005. Piscataway. NJ. USA.IEEE. Oct. 18, 2005. pp. 86-91. XP010859534. DOI: D01:10.1109/ISWC.2005.19, ISBN: 978-0-7695-2419-1.

* cited by examiner

ASSEMBLY, COMPONENT FOR AN ASSEMBLY AND METHOD OF MANUFACTURING AN ASSEMBLY

CROSS-REFERENCE TO RELATED APPLICATIONS

This application is a U.S. National Stage application under 35 U.S.C. §371 of International Application PCT/NL2011/050064 (published as WO 2011/093713 A1), filed Jan. 31, 2011 which claims priority to Application EP 10152129.2, filed Jan. 29, 2010. Benefit of the filing date of each of these prior applications is hereby claimed. Each of these prior applications is hereby incorporated by reference in its entirety.

BACKGROUND OF THE INVENTION

1. Field of the invention

The present invention relates to an assembly. The present invention further relates to a component for an assembly. The present invention still further relates to a method of manufacturing an assembly.

2. Related Art

An electro-physical transducer is defined herein as a device that converts an electrical signal into a physical phenomenon, or that converts a physical phenomenon into an electrical signal. Examples of the first are electro-luminescent devices, electro-acoustic devices, and electro-chrome devices. Examples of the second are photovoltaic devices, acoustic sensors, and touch sensors.

First stretchable substrate materials are available (e.g. Belgian-funded SWEET project or the EU-funded STELLA project). There is a need to assemble electro-physical transducer devices with such stretchable materials. Usually such elements themselves however are not stretchable. Electro-optical devices are known that are manufactured in the form of a flexible foil. Although this allows certain degrees of freedom it is still not possible to deform such devices into arbitrary shapes, for example in the form of a spherical shape. It may be considered to manufacture such devices into a particular predetermined shape for example by successively depositing layers onto a mold having the desired shape. However, this does not result in a product that is deformable during use.

Accordingly there is a need for means that enable assembly of relatively non-stretchable electro-physical transducer devices with a stretchable carrier, so that the assembly as a whole is a product that can be arbitrarily deformed during use. This need for example arises in medical applications wherein, for example in applications using photon radiation for treatment of the human skin. Another example is in robotics, wherein it is desired to have a touch sensitive function in an artificial skin, having a deformable shape. Also for application on static surfaces it is desirable to be capable of deforming the product, for example to apply the product on a certain three dimensional object, e.g. as a coverage of furniture or car interiors for example.

It is noted that WO/2009/134127 describes a composite microphone that comprises a flexible and stretchable substrate with a grid of flexible and stretchable first and second conductors. The first conductors are arranged transverse to the second conductors. A plurality of acoustic sensors is each in connection with a respective pair of conductors in the grid. The substrate carrying the acoustic sensors can be arranged upon arbitrary shaped surfaces, for example on a hemispheric surface, therewith obtaining a microphone that is sensitive in a large spatial angle.

Due to the mechanical coupling of the acoustic sensors with the stretchable substrate, the substrate is somehow restricted in its degrees of movement by the acoustic sensors. The restriction can be modest, as it is not required that the acoustic sensors cover a substantial portion of the surface area of the stretchable substrate. However, for example when electroluminescent elements are applied as the electro-physical transducer, it may be desired that the surface area is substantially covered to have a sufficiently large light-emitting area.

SUMMARY OF THE INVENTION

According to a first aspect of the invention there is provided an assembly of an electro-physical transducer on a flexible foil with a carrier. The flexible foil has a first main surface provided with at least a first electrically conductive track connected to the electro-physical transducer and opposite said first main surface a second main surface facing towards the carrier. At least a first incision extends through the flexible foil alongside said at least a first electrically conductive track. Therewith a strip shaped portion of the flexible foil is defined that carries a portion of the at least a first electrically conductive track. The at least a first electrically conductive track is electrically connected to an electrical conductor of the carrier. The flexible foil is attached to the carrier with its strip shaped portion.

Flexible and stretchable conductors for use in an elastic medium may be realized for example by providing them in a meandering shape, as described for example in US2007115572. Alternatively materials may be used that are inherently flexible, stretchable and conductive, e.g. a blend of a conductive and a non-conductive polymer as described for example in WO9639707. Use of textile carriers is for example described in WO 2010067283 and WO 2009133497.

A strip shaped portion carrying a portion of an electrically conductive track is understood to be a portion of the flexible foil having a length in the direction of the portion of the electrically conductive track that is at least twice its width. Preferably the length of the strip is at least five times its width. The strip shaped portion may be bounded between said at least a first incision and a second incision, or between said at least a first incision and an edge of the flexible foil opposite the portion of the electrically conductive track.

The strip shaped portion of the flexible foil provides for a partial mechanical decoupling of the flexible foil with the carrier, so that the carrier can deform without substantial restrictions, whereas deformations of the carrier do not damage the flexible foil. Despite the partial mechanical decoupling of the flexible foil and the carrier a reliable electrical connection is provided between the electro-physical transducer and electrical conductor of the carrier through the electrically conductive track that is at least partially carried by the strip shaped portion.

In an embodiment of the assembly according to the first aspect an electrical connection between the at least a first electrically conductive track and the electrical conductor of the carrier is formed by an electrically conductive element extending from the second surface, through the at least a first incision, against the at least a first electrically conductive track. As the incision extends alongside the electrically conductive track the electrical connection between the electrically conductive track and the electrically conductive element has a large tolerance in position, so that the electrical connection can be easily made even if the flexible foil is not very accurately placed.

In an embodiment of the assembly according to the first aspect, the electro-physical transducer is an OLED. In a typical application the at least a first electrically conductive track serves as an anode contact of the OLED and the flexible foil is further provided with a second electrically conductive track that serves as a cathode contact.

In an embodiment of this application the second electrically conductive track is coupled to a further electrical conductor on the carrier in a way analogous to the way the first electrically conductive track is coupled to the electrical conductor on the carrier. Alternatively the second electrically conductive track may be connected in another way.

Typically the electrically conductive element is an electrically conductive wire. The wire may be used to mechanically an electrically couple the flexible foil to the carrier. In an embodiment the electrically conductive wire is a spring. In this way a further mechanical decoupling between the flexible foil and the carrier is achieved, while maintaining an electrical connection.

In another embodiment the electrically conductive element is a staple like pitch. In this way the flexible foil may be rapidly and reliably attached.

In an embodiment the assembly according to the first aspect is provided with first and said second strip shaped portions that are arranged in mutually transverse directions at mutually neighbouring sides of the electro-physical transducer. In particular the first and second strip shaped portions are arranged alongside mutually neighbouring sides of the electro-physical transducer, and each carry a portion of a respective conductor to a respective electrode of the electro-physical transducer, for example to an anode and a cathode of an OLED. This arrangement provides for optimum degrees of freedom for the selection of the location where the respective conductors on the strip shaped portions can be connected to the electrical conductors of the carrier in arbitrary orientations of the flexible foil.

The present invention is particularly suitable for application in an assembly wherein the carrier is formed by a textile or a flexible foil. In particular the present invention is suitable for application with stretchable carriers.

The assembly according to the first aspect substantially preserves the degrees of freedom of the carrier, while limiting mechanical stress of the flexible foil with the electro-physical transducer. Nevertheless the present invention is also applicable to other carriers, e.g. rigid carriers.

In an embodiment of the assembly according to the first aspect the flexible foil has a first and a second mutually opposite side and a third side extending between the first and the second side, the flexible foil comprising a plurality of incisions, each extending from one of the first and the second side, wherein subsequent incisions extend from mutually opposite sides of the flexible foil, therewith forming a meandering strip, and wherein said electrically conductive track extends on said meandering strip. In this way it is possible to mechanically decouple an electro-physical transducer from the carrier, even if the flexible foil provided with the electro-physical transducer is relatively stiff. An even further mechanical decoupling between the electro-physical transducer and the carrier may be achieved when using a relatively flexible foil.

In an embodiment of the assembly according to the first aspect the second main surface of the flexible foil is provided with a first and a second mutually opposite magnetic pole that are magnetically coupled to respective magnetic poles provided on the surface of the carrier. The cooperation of magnetic poles of the flexible foil with magnetic poles of the carrier facilitates alignment of the flexible foil with the carrier. Additionally the magnetic adherence provides for a mechanical coupling. The mechanical coupling may be strengthened by additional fastening means. E.g. by an adhesive and/or by a wire connection. The additional fastening means may contribute to an electrical connection from the carrier to the electro-physical transducer.

In an embodiment of the assembly, an electrical connection between the at least a first electrically conductive track and the electrical conductor of the carrier includes an electrically conductive member extending from said at least the first electrically conductive track through the strip shaped portion of the flexible foil. Said electrical connection may further include an electrically conductive adhesive arranged between the flexible foil and the carrier. Alternatively the electrical connection may further include a pair of magnetic poles, one arranged on the second main surface of the flexible foil and the other one arranged on the main surface of the carrier. Also the electrical connection may be achieved by a combination of these measures, e.g. the pair of cooperating magnetic poles may be electrically coupled to each other via an electrically conductive adhesive. The magnetic pressure therewith contributes to a reliable adherence of the adhesive.

According to a second aspect of the invention a method of providing an assembly of an electro-physical transducer on a flexible foil and a carrier, wherein said flexible foil has a first main surface and a second main surface opposite the first main surface and facing the carrier, comprises the following steps, providing at the first surface of the flexible foil at least a first electrically conductive track that is electrically coupled to said electro-physical transducer, providing at least a first incision through the flexible foil, arranging said flexible foil with its second surface on said carrier, said at least a first electrically conductive track extending alongside the at least a first incision therewith forming a strip shaped portion of the flexible foil that carries a portion of the at least a first conductive track, electrically connecting the at least a first electrically conductive track to an electrical conductor of the carrier.

According to a third aspect of the invention a flexible foil is provided comprising an electro-physical transducer. Therein the flexible foil has a first main surface provided with at least a first electrically conductive track and opposite said first main surface a second main surface, at least a first incision extends through the flexible foil alongside said at least a first electrically conductive track, therewith defining a strip shaped portion of the flexible foil that carries a portion of the at least a first conductive track.

BRIEF DESCRIPTION OF THE DRAWINGS

These and other aspects are described in more detail with reference to the drawing. Therein:

FIG. 2 is a top-view, and FIG. 3 is a side-view according to III in FIG. 2, FIG. 4A-4E schematically illustrate steps of a method according to the second aspect of the invention, therein.

DETAILED DESCRIPTION OF EMBODIMENTS

Figure 1A:
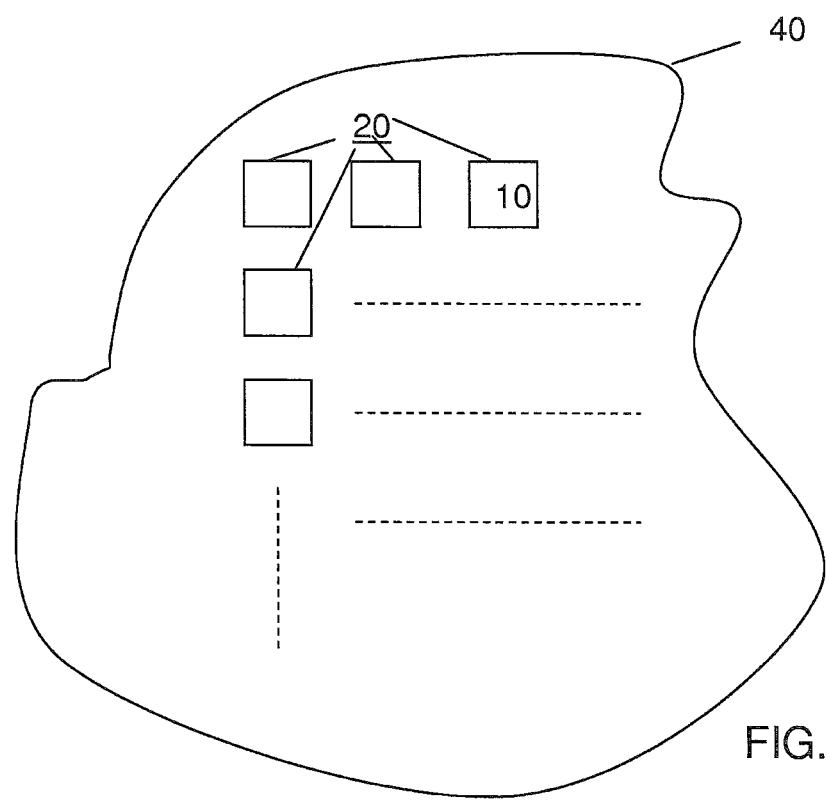
FIG. 1A schematically shows an assembly according to the first aspect of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various items these items should not be limited by these terms. Items are understood too mean features described such components or elements or aspects of components or elements, e.g. a surface of an element or a height of an element. These terms are only used to distinguish one item from another item. Thus, a first item could be termed a second item without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 9A:
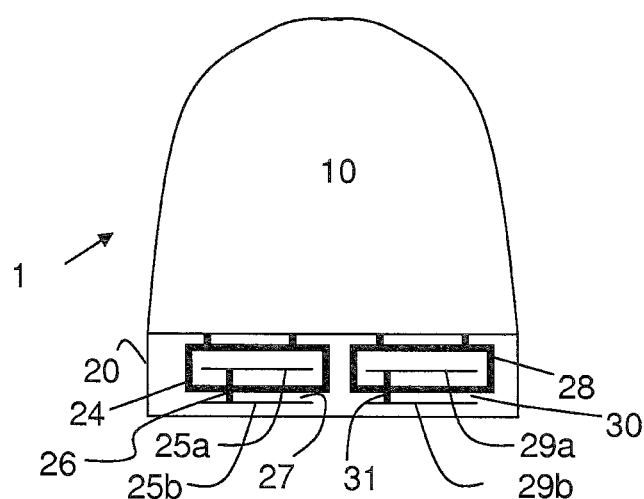
FIG. 9B shows an arrangement of said parts in this further embodiment.
Figure 9B:
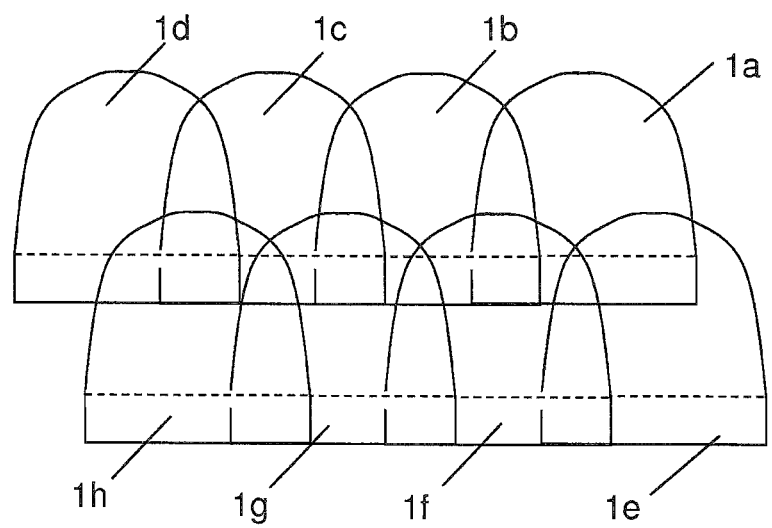

FIG. 1A schematically shows an assembly of electro-physical transducers 10 on a flexible foil 20 with a carrier 40. Typically the carrier 40 is deformable. By way of example the carrier is a textile, or a stretchable flexible foil. The flexible foils 20 are arranged as tiles on carrier. Typically these tiles are square with a side in the range of 1 to 15 cm, but also smaller sizes are possible, e.g. from 50 μm onwards. Also other shapes are possible, as shown in FIG. 9A, for example. The tiles may be arranged at distance from each other, as shown in FIG. 1A, but may alternatively overlap each other, e.g. in a fish scale pattern as shown in FIG. 9B.

Figure 1B:
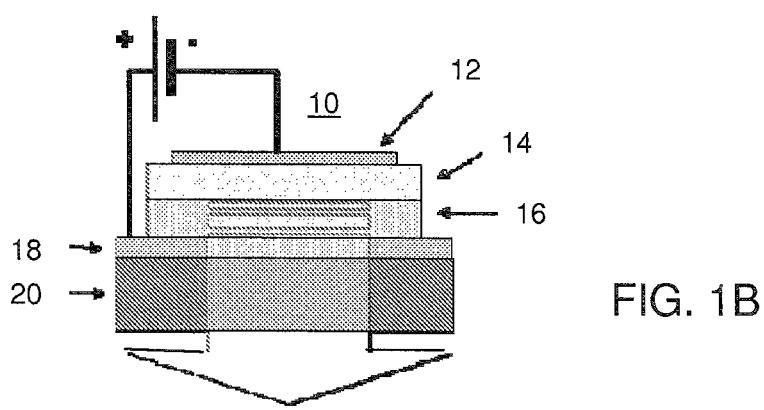
FIG. 1B shows in more detail a typical example of a part for use in said assembly.

FIG. 1B schematically shows an example of an electro-physical transducer. In the example shown the electro-physical transducer is a light emitting element. In particular the light emitting element is an organic light emitting device (OLED). The OLED 10 is arranged on a flexible foil 20 and comprises a cathode 12, a light-emitting polymer 14 and an anode 16. The OLED comprises an encapsulation 18 of which a portion is shown.

Figure 2:
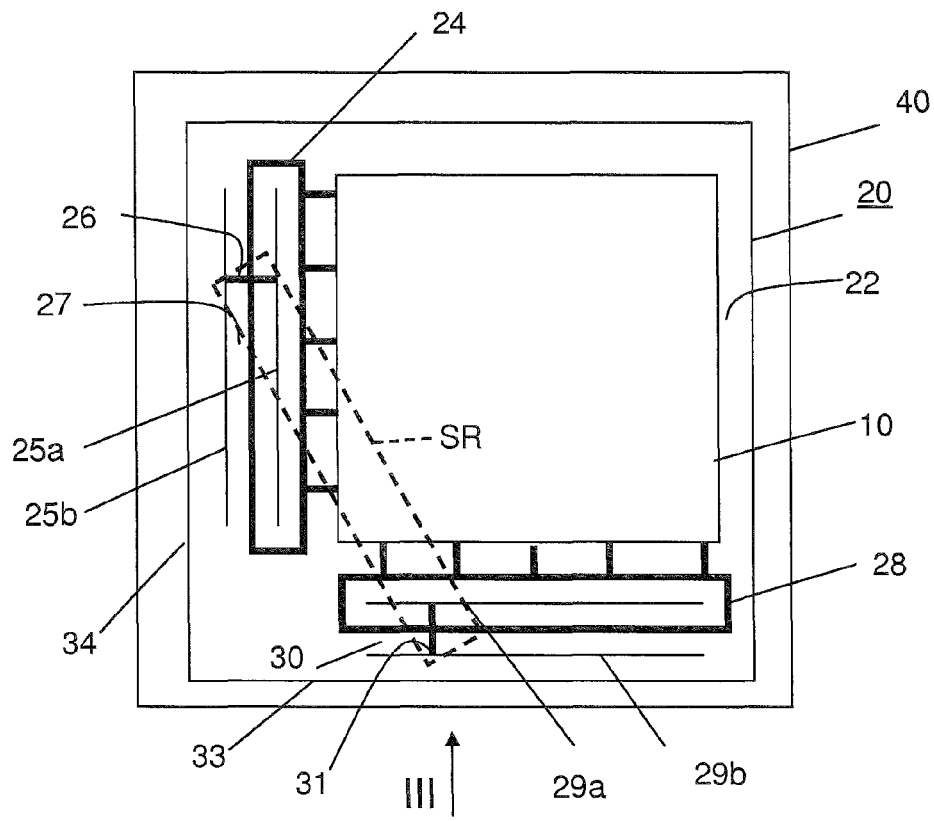
FIG. 2 and FIG. 3 show an embodiment of an assembly according to the first aspect in more detail, therein.
Figure 3:
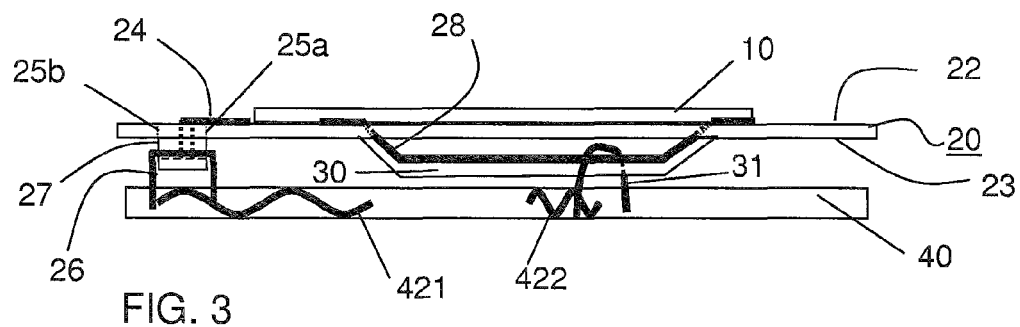

FIG. 2 and FIG. 3 show an assembly of an electro-physical transducer 10 on a flexible foil 20 with a carrier 30. FIG. 2 is a top-view, and FIG. 3 is a side-view according to III in FIG. 2. The flexible foil 20 has a first main surface 22 provided with at least a first electrically conductive track 24 and opposite said first main surface 22 a second main surface 23 (See FIG. 3) facing towards the carrier 40.

At least a first incision 25a extends through the flexible foil 20 alongside said at least a first electrically conductive track 24, and therewith defines a strip shaped portion 27 of the flexible foil that carries a portion of the at least a first conductive track 24. In the embodiment shown the strip shaped portion 27 is bounded on a side opposite the first incision by a second incision 25b. In another embodiment the stripshaped portion may be bounded by an edge of the flexible foil 20.

The at least a first electrically conductive track 24 is electrically connected to an electrical conductor 421 of the carrier 40, by an electrically conductive element 26 extending from the second main surface 23, through the at least a first incision 25a, against the at least a first electrically conductive track 24. The electrically conductive element 26 in addition provides for a mechanical connection of the flexible foil 20 to the carrier 30. Alternatively or in addition a mechanical connection may be formed by other means, e.g. an adhesive, e.g. a hot-melt adhesive, such as a polyurethane or alternatively an epoxy-based adhesive.

In the assembly shown in FIG. 2 and FIG. 3, the at least a first electrically conductive track 24 serves as an anode contact of the OLED. The flexible foil 20 is provided with a second electrically conductive track 28 that serves as a cathode contact. A first and a second further incision 29a, 29b extend on mutually opposite sides alongside the second electrically conductive track 28 and defines a second strip shaped portion 30. Likewise the second electrically conductive track 28 is electrically connected to an electrical conductor 422 of the carrier 40, by a further electrically conductive element 31. Likewise the further electrically conductive element 31 provides for a mechanical connection with the substrate 40.

The first and the second strip shaped portions 27, 30 allow the remainder of the flexible foil 20 to move with respect to the carrier 40 while a reliable electric connection is realized with the conductors of the carrier 40. The strip shaped portions may be modified to change its mechanical properties, such as its deformability, for example by irradiation, by chemical processing, or by other means.

In the assembly shown in FIGS. 2 and 3, the first and the second strip shaped portions 27, 30 said are arranged in mutually transverse directions at mutually neighbouring sides of the OLED.

Figure 12:
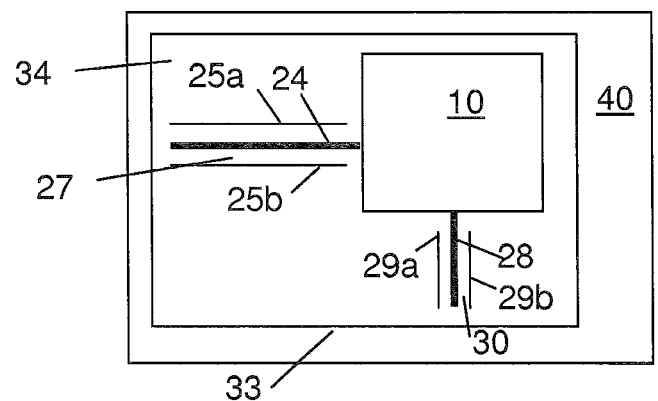
FIG. 12 shows in top-view a further embodiment of an assembly according to the first aspect.

In FIG. 2 it can be seen that the strip shaped portion 27 extends between the electro-physical transducer 10 and a side 34 of the flexible foil 20 in a direction alongside said side 34. Likewise, the strip shaped portion 30 extends between the electro-physical transducer 10 and a further side 33 of the flexible foil 20 in a direction alongside said further side 33. An alternative possibility is illustrated in FIG. 12. The arrangement of FIG. 2 is advantageous in that a relatively large area of the flexible foil 20 is available for the electro-physical transducer 10.

With respect to FIG. 2 it is further noted that a smallest rectangle SR surrounding each of the connections of the flexible foil 20 to the carrier 40 has an area of at most 10% of the area of the first main surface of the flexible foil. In this case the rectangle SR surrounds the electrically conductive elements 26 and 31 that mechanically (and electrically) connect the flexible foil to the carrier. Other connections may be formed for example by magnetic or adhesive elements. Such connections may additionally form an electrical connection. In the embodiment shown the smallest rectangle SR surrounding the connections formed by the elements 26, 31 has an area of (1.2×8.9=) 10.7 units. The first main surface 22 of the flexible foil 20 has an area of (10.9×11.4=) 124 units. Accordingly the area of the smallest rectangle is about 8.6% of the area of the main surface of the flexible foil 20. The relatively small area of not more than 10% occupied by the mechanical contact between the flexible foil 20 and the carrier 40 further enhances mobility of the carrier 40.

FIG. 4A-4E schematically illustrate a method of connecting an electro-physical transducer 10 on a flexible foil 20 having a first and a second mutually opposite surface 22, 23 (See FIG. 3) to a carrier.

Figure 4A:
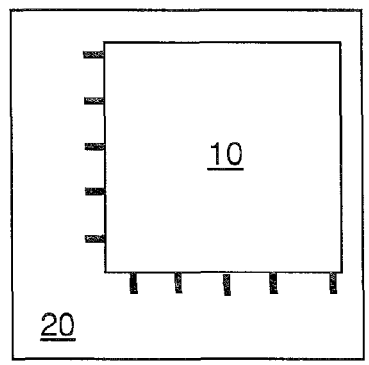
FIG. 4A shows a first step of providing a first part to be assembled.
Figure 4B:
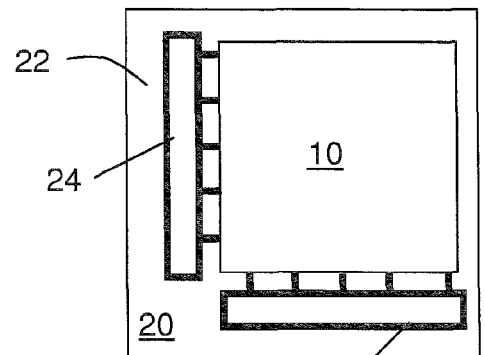
FIG. 4B shows a second step, FIG. 4C a third step.

Therein FIG. 4A shows a top-view of the flexible foil 20 with the electrophysical transducer 10. In a first step, shown in FIG. 4B, a first surface of the flexible foil is provided with at least a first electrically conductive track 24 that is electrically coupled to said electro-physical transducer 10. Additionally a second track 28 is provided at the first surface that is electrically coupled to said electro-physical transducer 10. Here the electro-physical transducer is an OLED, and the first and the second electrically conductive track 24, 28 are coupled respectively to the anode and the cathode of the OLED 10. Typically the electrically conductive tracks 24 and 28 are provided by deposition on the surface 22, for example by printing an electrically conductive ink, or a precursor thereof followed by curing.

Figure 4C:
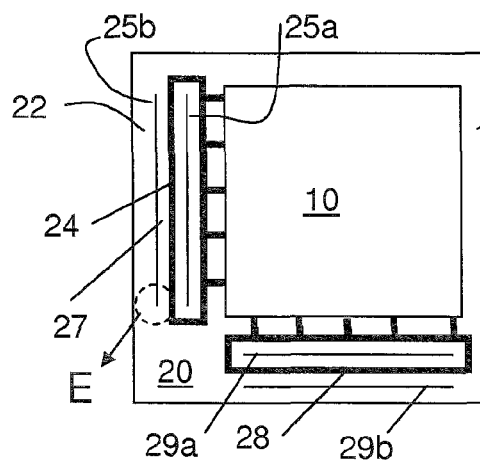
FIG. 4D shows fourth step.
FIG. 4E shows a detail according to E in FIG. 4C.

In a third step, shown in FIG. 4C at least a first incision 25a through the flexible foil 20 is formed. As shown in FIG. 4C the at least a first electrically conductive track 24 extends alongside the at least a first incision 25a around an end of said incision 25a towards an opposite side of said incision 25a. Therewith a strip shaped portion 27 of the flexible foil 20 is formed that carries a portion of the at least a first conductive track 24. A strip shaped portion of the flexible foil is intended to mean a portion having a length that is at least twice as large as its width. Here, the length is defined as the dimension in the direction of the incision and the width is defined as the dimension transverse to the direction of the incision. In this case the strip shaped portion 27 is bounded in its width by a second incision 25b. Alternatively however the strip shaped portion may be bounded by an edge of the flexible foil 20. In the embodiment shown further incisions 29a, 29b are provided at mutually opposite sides of a portion of the second electrically conductive track 28. The incisions 25a, 25b, 29a, 29b are typically formed by laser cutting, but may alternatively be formed with a sharp tool. Instead of first providing the electrically conductive tracks 24 and 28, and subsequently forming the incisions 25a, 25b, 29a, 29b, it is alternatively possible to form the incisions first and then provided the electrically conductive tracks. As shown for incision 25c in FIG. 4E (which is a detail according to E in FIG. 4C), the incisions 25c are provided with incision prolongation stoppers 25s in the form of a circularly widened end portion of the incision.

Figure 4D:
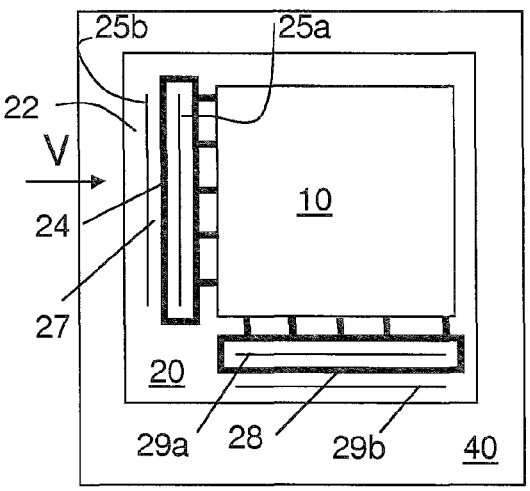
Figure 4E:
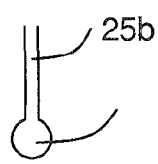

As shown in FIG. 4D the flexible foil 10 is subsequently arranged with its second surface (not shown) opposite main surface 22 on the carrier 40. Alternatively the flexible foil 10 may be arranged on the carrier 40 before the incisions 25a, 25b, 29a, 29b and the electrically conductive tracks 24 and 28 are formed.

After assembly of the flexible foil 10 with the carrier 40 the at least a first electrically conductive track 24 is electrically connected to an electrical conductor of the carrier, by applying an electrically conductive element 26 from the second surface, through the first incision 25a, against the at least a first electrically conductive track 24. The electrically conductive element 26 may be an electrical conductor of the carrier, but may alternatively be a separate electrically conductive element. Examples thereof are schematically shown in FIG. 5 and FIG. 6 according to view V in FIG. 4D.

Figure 5:
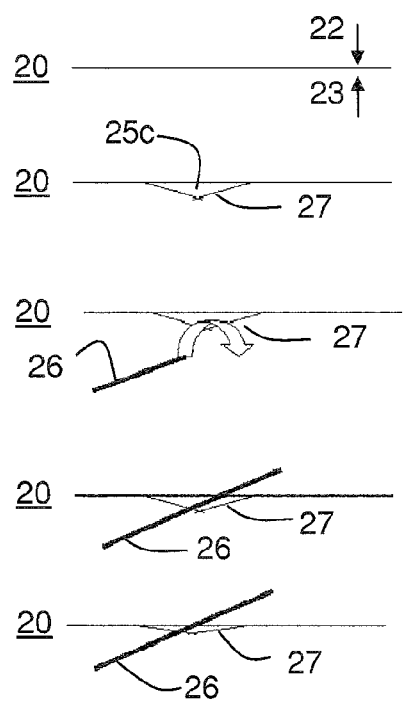
FIG. 5 shows a fifth step in a first embodiment of the method according to the second aspect.

The first illustration (1) in FIG. 5 shows the flexible foil 20. The second illustration (2) shows the strip shaped portion 27 that is bended out of the plane of the remainder of the flexible foil 20. Therewith an opening 25c is formed. The strip shaped portion 27 may be bended down for example by a tool that presses said portion 27 downward. Alternatively the strip shaped portion 27 may have magnetic elements that are pulled downward by a magnetic tool. The third illustration (3) shows how an electrically conductive element 26 is fed through the opening against the at least a first electrically conductive track carried by the strip shaped portion 27. The fourth illustration (4) shows the result thereof. The fifth illustration shows the flexible foil 20 after the strip shaped portion is released and has bent back.

Figure 6:
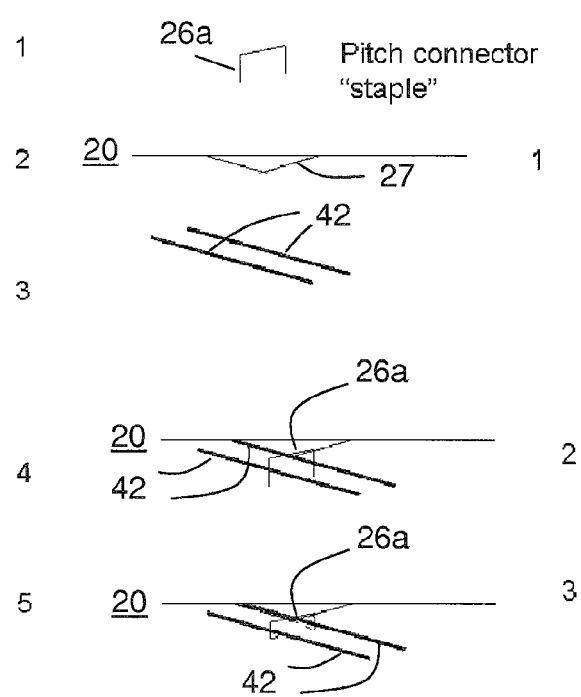
FIG. 6 shows a fifth step in a second embodiment of the method according to the second aspect.

FIG. 6 shows an alternative, wherein a staple like pitch 26a is used to connect the electrically conductive track to an electrical conductor 42 of the carrier, in this case to a pair of electrical conductors 42 (See illustration 1). The second illustration (2) shows the staple like pitch 26a pressed downwards. In the illustration the staple like pitch 26a embraces the electrical conductors 42 of the carrier, so that an electrical connection is formed between these electrical conductors and the electrically conductive track on the strip shaped portion 27 (See illustration 3).

Figure 7:
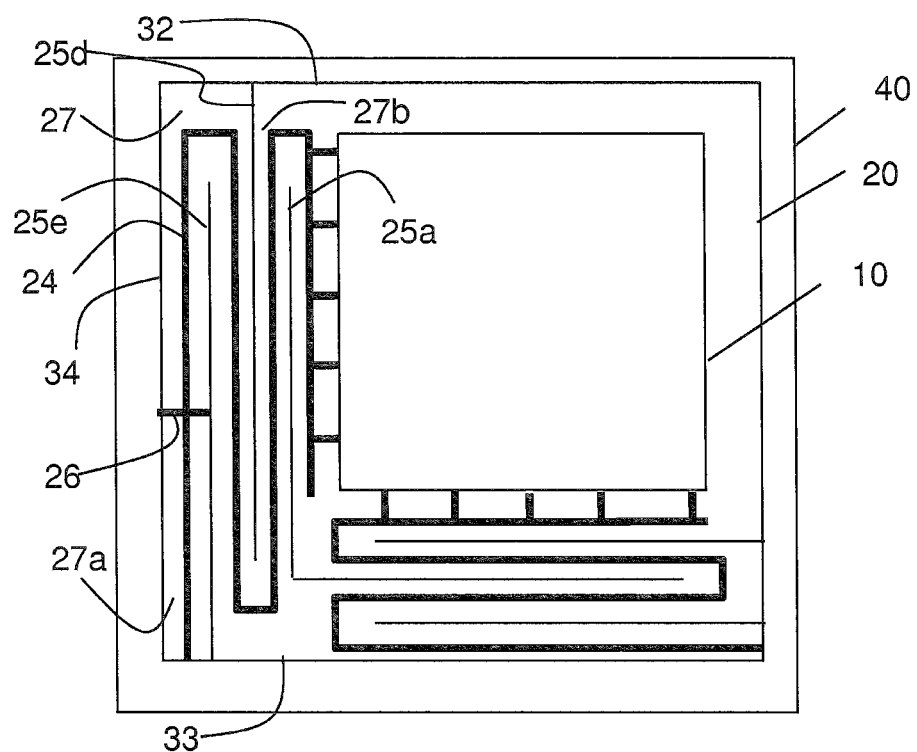
FIG. 7 shows a further embodiment of an assembly according to the first aspect in more detail, FIG. 8A schematically shows a part in a further embodiment of an assembly according to the first aspect.

FIG. 7 shows a further assembly wherein the flexible foil 20 has a first and a second mutually opposite side 32, 33 and a third side 34 extending between the first and the second side. In this case the flexible foil has a plurality of incisions 25d, 25e that each extend from one of the first and the second side 32, 33 respectively. Subsequent incisions 25d, 25e extend from to mutually opposite sides of the flexible foil, therewith forming a strip 27 that meanders from an end 27a to an end 27b. The electrically conductive track 24 extends on said meandering strip 27. In the embodiment of FIG. 7, the electrically conductive element 26 extends from the incision 25e to the outer edges 34 of the flexible foil 20.

Figure 8A:
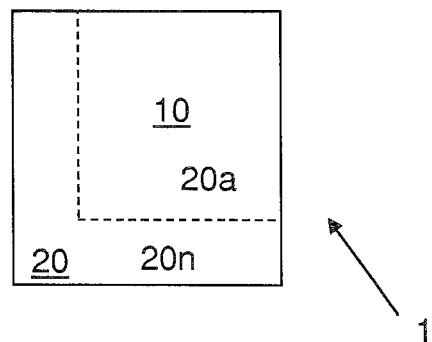
FIG. 8B shows an arrangement of said parts in this further embodiment, FIG. 9A schematically shows a part in a further embodiment of an assembly according to the first aspect.
Figure 8B:
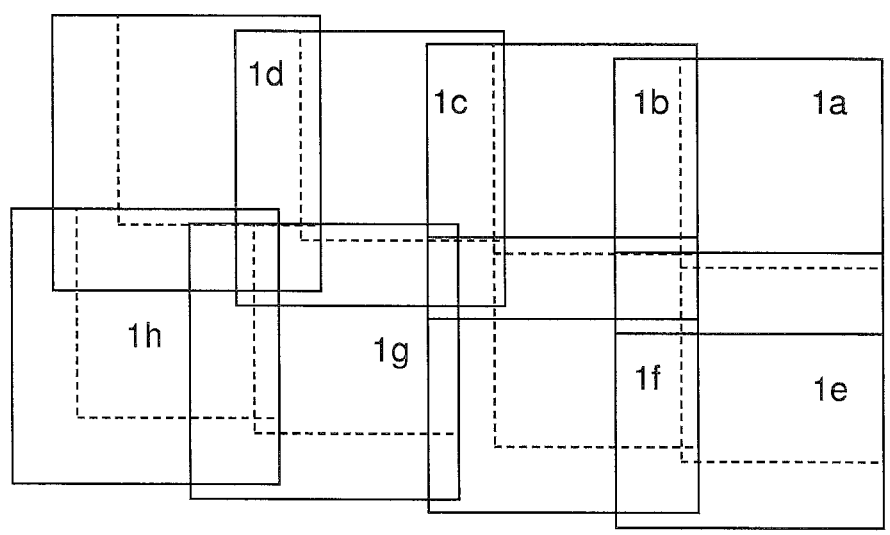

FIG. 8A schematically shows a tile 1 formed by a flexible foil 20 carrying an electro-physical transducer 10. The portion of the flexible foil 20 carrying the electro-physical transducer 10 is considered an active portion 20a. The remaining portion 20n is considered a non-active portion. In order to provide a continuous active surface, the tiles can be arranged according to a fish scale pattern, wherein tiles 1 are arranged according to a fish scale pattern wherein inactive portions of tiles 1 are covered by active portions of other tiles. FIG. 8B schematically shows a fish scale pattern of tiles 1a, . . . 1h. Therein in a first row an active portion of tile 1b overlaps an inactive portion of tile 1a, an active portion of tile 1c overlaps an inactive portion of tile 1b. In a next row an active portion of tile 1e overlaps an inactive portion of tile 1a, and an active portion of tile 1f overlaps an inactive portion of tile 1b, as well as an inactive portion of tile 1e. Depending on the application an active portion of a tile may extend until over the active portion of another tile. In this way an agglomeration of active surfaces is obtained that is still continuous even if the carrier on which the tiles are arranged is stretched.

FIG. 9A shows another example of a tile. Parts therein corresponding to those in FIG. 2 have a similar reference number. In the embodiment of FIG. 9A, the active portion formed by OLED 10 has a rounded edge.

FIG. 9B schematically shows a fish scale pattern of tiles as shown in FIG. 9A. Therein the active portions of tiles 1e-1h overlap the inactive portions of tiles 1a-1d.

Figure 10A:
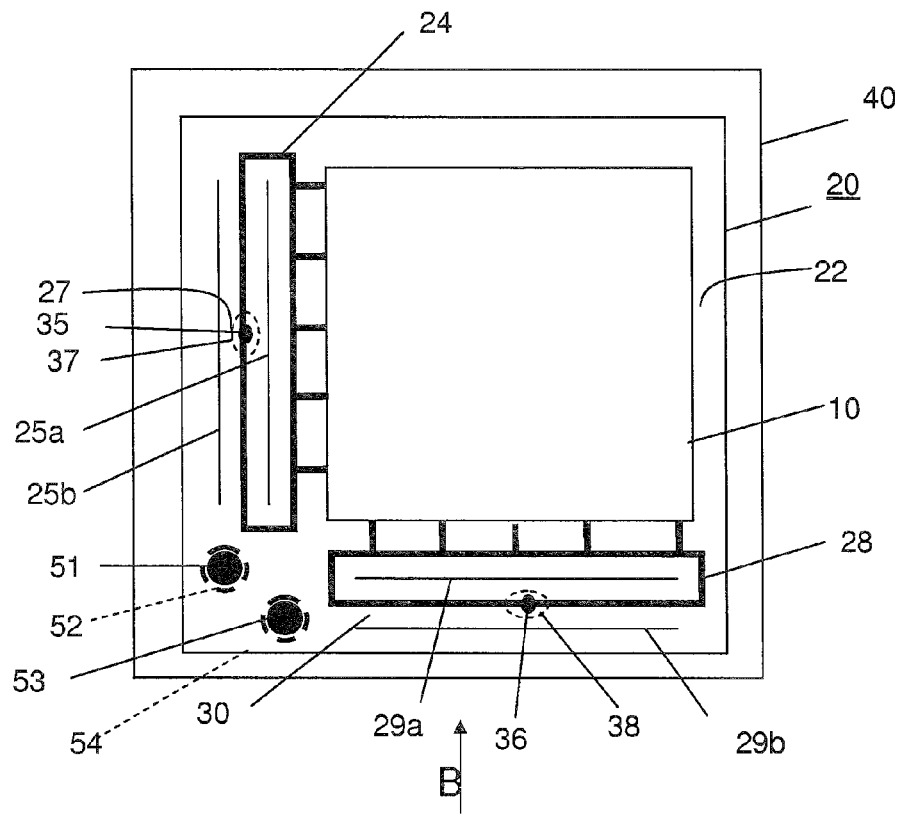
FIG. 10A and FIG. 10B show a further embodiment of an assembly according to the first aspect in more detail, therein.
Figure 10B:
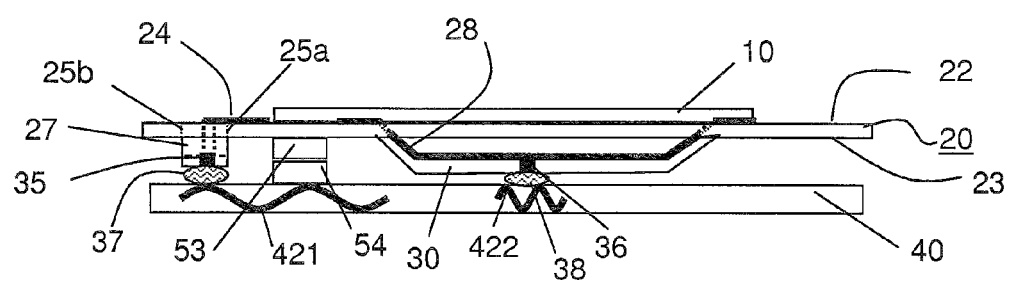

FIGS. 10A and 10B show a further embodiment of an assembly according to the first aspect of the invention. Parts therein corresponding to those in FIGS. 2 and 3 have the same references.

In the embodiment shown in FIG. 10A and 10B the second main surface 23 of the flexible foil 20 is provided with a first and a second mutually opposite magnetic pole 51, 53. The magnetic poles 51, 53 of the flexible foil 20 are magnetically coupled to respective magnetic poles 52, 54 provided on the surface of the carrier 40. For clarity magnetic poles 51 and 52 are only shown in FIG. 10A. The magnetic poles on the second main surface 23 of the flexible foil and their counterparts 52, 54 on the carrier, facilitate alignment of the flexible foil 20 with the carrier 40.

In the embodiment of FIG. 10A, 10B an electrical connection between the at least a first electrically conductive track 24 and the electrical conductor 421 of the carrier 40 includes an electrically conductive member 35 extending from said at least a first electrically conductive track 24 through the flexible foil 20. Likewise an electrical connection between the electrically conductive track 28 and a further electrical conductor 422 of the carrier 40 includes an electrically conductive member 36 extending from the electrically conductive track 28 through the flexible foil 20. In the embodiment shown the electrically conductive member 35 is electrically connected to the electrical conductor 421 of the carrier via an electrically conductive adhesive 37, such as an epoxy based adhesive filled with Ag, arranged between the flexible foil and the carrier. Likewise the electrically conductive member 36 is electrically connected to the further electrical conductor 422 of the carrier 40 via another electrically conductive adhesive 38 arranged between the flexible foil and the carrier. The magnetic adherence provided by the paired magnetic poles 51, 52 and 53, 54 keeps the flexible foil in place while the adhesive 37, 38 is cured. A separate tool for that purpose is superfluous.

This arrangement of magnetic poles may also be provided in other embodiments, for example in the embodiment described with reference to FIGS. 2 and 3, FIG. 7, FIGS. 8, 8A and FIG. 9, 9A.

Figure 11A:
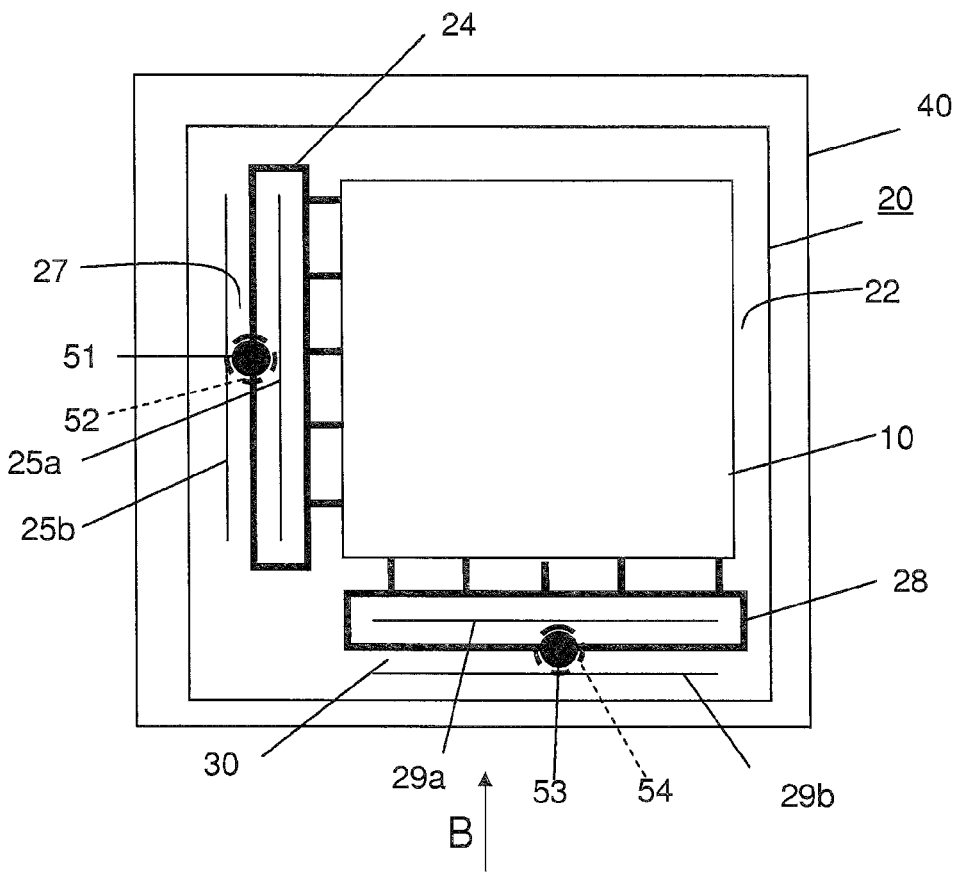
FIG. 11A is a top-view.
Figure 11B:
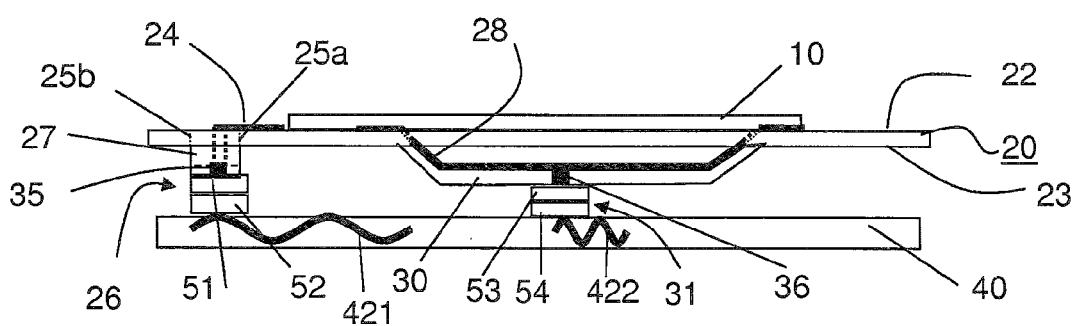
FIG. 11B is a side-view according to B in FIG. 11A.

FIGS. 11A and 11B show a further embodiment of an assembly according to the first aspect of the invention. As in the embodiment of FIG. 10A, 10B the electrically conductive tracks 24, 28 are coupled to electrical conductors 421, 422 of the carrier 40 via respective electrically conductive members 35, 36 that extend from the electrically conductive tracks 24, 28 through the flexible foil 20. In this embodiment however, the electrical connections each further includes a pair of magnetic poles.

The electrical connection to conductive track 24 is provided via a first magnetic pole 51 arranged on the second main surface 23 of the flexible foil 20 and a second magnetic pole 52 arranged on the main surface of the carrier 40. The poles 51, 52 cooperate, i.e. are of mutually opposite polarity, so that a mechanical connection is provided by magnetic force. Likewise poles 53 and 54 cooperate. The magnetic attraction may be strong enough to provide for a sufficient adherence of the flexible foil 20 to the carrier 40. Nevertheless the flexible foil 20 may be adhered to the carrier 40 by other means. For example the flexible foil 20 may be additionally adhered to the carrier 40 by an adhesive. For example an electrically conductive adhesive may be used that is arranged between the mutually cooperating poles.

FIG. 12 shows an alternative arrangement for the strip shaped portions 27. Therein the strip shaped portion 27 extends between the electro-physical transducer 10 and a side 34 of the flexible foil 20 in a direction transverse to said side 34. Likewise, the strip shaped portion 30 extends between the electro-physical transducer 10 and a further side 33 of the flexible foil 20 in a direction transverse to said further side 33.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Assembly of an electro-physical transducer on a flexible foil with a carrier that is a textile, wherein
    the flexible foil has a first main surface provided with at least a first electrically conductive track connected to the electro-physical transducer and opposite said first main surface a second main surface facing towards the textile,
    at least a first incision extends through the flexible foil alongside said at least a first electrically conductive track, therewith defining a strip shaped portion of the flexible foil that carries a portion of the at least a first electrically conductive track,
    the at least a first electrically conductive track is electrically connected to an electrical conductor of the textile,
    the flexible foil is attached to the textile with its strip shaped portion, and
    wherein the carrier is stretchable.

2. Assembly according to claim 1, wherein an electrical connection between the at least a first electrically conductive track and the electrical conductor of the carrier is formed by an electrically conductive element extending from the second surface, through the at least a first incision, against the at least a first electrically conductive track.

3. Assembly according to claim 2, wherein the flexible foil has at least a second incision extending through the flexible foil at a side of said at least a first electrically conductive track opposite the at least a first incision, and wherein the electrically conductive element further extends through said at least a second incision.

4. Assembly according to claim 2, wherein the electrically conductive element is an electrically conductive wire.

5. Assembly according to claim 4, wherein the electrically conductive wire is a spring.

6. Assembly according to claim 2, wherein the electrically conductive element is a staple like pitch.

7. Assembly according to claim 1, wherein the at least a first electrically conductive track serves as a first contact of the electro-physical transducer and wherein the flexible foil is provided with a second electrically conductive track that serves as a second contact.

8. Assembly according to claim 7, wherein said second electrically conductive track is coupled to a further electrical conductor on the carrier a portion of said second electrically conductive track being carried by a second strip shaped portion.

9. Assembly according to claim 8, wherein said first and said second strip shaped portions are arranged in mutually transverse directions and at mutually neighbouring sides of the electro-physical transducer.

10. Assembly according to claim 7, wherein the electro-physical transducer is an OLED and wherein the at least a first electrical conductor and the second electrical conductor serve as a contact to an anode and a cathode of the OLED respectively.

11. Assembly according to claim 1, wherein said at least a first incision ends into an incision prolongation stopper.

12. Assembly according to claim 1, wherein the flexible foil has a first and a second mutually opposite side and a third side extending between the first and the second side, the flexible foil comprising a plurality of incisions, each extending from one of the first and the second side, wherein subsequent incisions extend from mutually opposite sides of the flexible foil, therewith forming a meandering strip, and wherein said electrically conductive track extends on said meandering strip.

13. Assembly according to claim 1, wherein a smallest rectangle surrounding each of the connections of the flexible foil to the carrier has an area of at most 10% of the area of the first main surface of the flexible foil.

14. Assembly of an electro-physical transducer on a flexible foil with a carrier, wherein
the flexible foil has a first main surface provided with at least a first electrically conductive track connected to the electro-physical transducer and opposite said first main surface a second main surface facing towards the carrier,
at least a first incision extends through the flexible foil alongside said at least a first electrically conductive track, therewith defining a strip shaped portion of the flexible foil that carries a portion of the at least a first electrically conductive track.
the at least a first electrically conductive track is electrically connected to an electrical conductor of the carrier,
the flexible foil is attached to the carrier with its strip shaped portion, wherein the second main surface of the flexible foil is provided with a first and a second mutually opposite magnetic pole that are magnetically coupled to respective magnetic poles provided on the surface of the carrier.

15. Assembly according to claim 14, wherein said carrier is a textile.

16. Assembly according to claim 15, wherein said carrier is stretchable.

17. Assembly according to claim 14, wherein said carrier is a flexible foil.

18. Assembly according to claim 14, wherein an electrical connection between the at least a first electrically conductive track and the electrical conductor of the carrier includes an electrically conductive member extending from said at least a first electrically conductive track through the strip shaped portion carrying the first electrically conductive track of the flexible foil.

19. Assembly according to claim 18, wherein said electrical connection between the at least a first electrically conductive track and the electrical conductor of the carrier further includes an electrically conductive adhesive arranged between the flexible foil and the carrier.

20. Assembly of an electro-physical transducer on a flexible foil with a carrier, wherein
the flexible foil has a first main surface provided with at least a first electrically conductive track connected to the electro-physical transducer and opposite said first main surface a second main surface facing towards the carrier,
at least a first incision extends through the flexible foil alongside said at least a first electrically conductive track, therewith defining a strip shaped portion of the flexible foil that carries a portion of the at least a first electrically conductive track,
the at least a first electrically conductive track is electrically connected to an electrical conductor of the carrier,
the flexible foil is attached to the carrier with its strip shaped portion,
wherein an electrical connection between the at least a first electrically conductive track and the electrical conductor of the carrier includes an electrically conductive member extending from said at least a first electrically conductive track through the strip shaped portion carrying the first electrically conductive track of the flexible foil, and
wherein said electrical connection further includes a pair of magnetic poles, one arranged on the second main surface of the flexible foil and the other one arranged on the main surface of the carrier.

21. Assembly of an electro-physical transducer on a flexible foil with a carrier, wherein
the flexible foil has a first main surface provided with at least a first electrically conductive track connected to the electro-physical transducer and opposite said first main surface a second main surface facing towards the carrier,
at least a first incision extends through the flexible foil alongside said at least a first electrically conductive track, therewith defining a strip shaped portion of the flexible foil that carries a portion of the at least a first electrically conductive track,
the at least a first electrically conductive track is electrically connected to an electrical conductor of the carrier,
the flexible foil is attached to the carrier with its strip shaped portion,
wherein said flexible foil with electro-physical transducer forms a tile, said tile being one of a plurality of similar tiles, wherein said tiles overlay according to a fish scale pattern.

22. Assembly according to claim 21, wherein each tile comprises a first, active area and a second, inactive area, the second inactive area having electric supply contacts, and wherein the first active area of tiles of the plurality of tiles overlays the second inactive area of other tiles of the plurality of tiles.

23. Assembly according to claim 21, wherein a non overlayed portion of the tiles has a rounded side.

* * * * *